US006728917B2

United States Patent
Abramovici et al.

(10) Patent No.: US 6,728,917 B2
(45) Date of Patent: Apr. 27, 2004

(54) SEQUENTIAL TEST PATTERN GENERATION USING COMBINATIONAL TECHNIQUES

(75) Inventors: Miron Abramovici, Berkeley Heights, NJ (US); Xiaoming Yu, Champaign, IL (US)

(73) Assignee: Agere Systems Inc., Allentown, PA (US)

( * ) Notice: Subject to any disclaimer, the term of this patent is extended or adjusted under 35 U.S.C. 154(b) by 519 days.

(21) Appl. No.: 09/780,861

(22) Filed: Feb. 9, 2001

(65) Prior Publication Data

US 2002/0112209 A1 Aug. 15, 2002

(51) Int. Cl.$^7$ ................... G06F 11/263; G01R 31/26
(52) U.S. Cl. ................... 714/744; 714/728
(58) Field of Search ................... 714/724, 726–729, 714/738, 739, 744

(56) References Cited

U.S. PATENT DOCUMENTS

| | | | | |
|---|---|---|---|---|
| 5,271,019 A | * | 12/1993 | Edwards et al. | 714/730 |
| 5,559,811 A | | 9/1996 | Abramovici et al. | |
| 5,566,187 A | | 10/1996 | Abramovici et al. | |
| 5,590,135 A | | 12/1996 | Abramovici et al. | |
| 5,625,630 A | | 4/1997 | Abramovici et al. | |
| 5,642,363 A | * | 6/1997 | Smith | 714/729 |
| 5,719,878 A | * | 2/1998 | Yu et al. | 714/726 |
| 6,370,662 B2 | * | 4/2002 | Hamidi | 714/724 |
| 6,519,729 B1 | * | 2/2003 | Whetsel | 714/727 |
| 6,553,525 B1 | * | 4/2003 | Shephard, III | 714/733 |

OTHER PUBLICATIONS

"A Simplified Method for Testing the IBM Pipeline Partial–Scan Microprocessor" Chen et al. Test Symposium, 1999. (ATS '99 Proceedings. Eighth Asian, 16–18.*
"Delay–Testable Non–Scan Sequential Circuits with Clock Suppression" Tekumalla, et al. 'Connecting the World' IEEE International Symposium on Circuits and Systems, 1996. vol. 4, May 12–15 1996 pp. 137–140 vol. 4.*
"Delay Testing with Clock Control: An Alternative to Enhanced Scan" □□ Tekumalla et al. International Test Conference, 1997. Nov. 1–6 1997 pp. 454–462.*
IBM Technicall Disclosure Bulletin vol. 25 issue 5 pg 2314–2315 "Chip Partitioning Aid" Oct. 1, 1982.*
Y. Bertrand et al., "Multiconfiguration Technique to Reduce Test Duration for Sequential Circuits," International Test Conference, pp. 989–997, 1993.
M. Abramovici et al., "SMART and FAST: Test Generation for VLSI Scan–Design Circuits," IEEE Design & Test, pp. 43–54, 1986.
1. M. Abramovici et al., "FREEZE!: A New Approach for Testing Sequential Circuits," Proc. 29th Design Automation Conf., pp. 22–25, Jun. 1992.
Y. Santoso et al., "FreezeFrame: Compact Test Generation Using a Frozen Clock Strategy," Proc. Design Automation and Test in Europe Conf., 6 pages, Mar. 1999.

(List continued on next page.)

Primary Examiner—Albert Decady
Assistant Examiner—Cynthia Britt
(74) Attorney, Agent, or Firm—Ryan, Mason & Lewis, LLP

(57) ABSTRACT

Test pattern generation is performed for a sequential circuit by first separating the circuit into overlapping pipelines by controlling corresponding clocks for one or more registers of the circuit so as to break feedback loops of the circuit, and then processing each of the pipelines separately in order to determine if particular target faults are detectable in the pipelines. Independent clocks may be provided for each of a number of registers of the circuit in order to facilitate the breaking of the feedback loops. The processing of the pipelines may include a first processing operation which detects target faults in a single time frame, and a second processing operation which detects target faults in two or more time frames. The first processing operation generates as many combinational test vectors as possible for each of the pipelines, while the second processing operation generates sequences of two or more combinational test vectors for each of the pipelines. Advantageously, the invention allows efficient combinational test pattern generation techniques to be applied to a sequential circuit.

28 Claims, 6 Drawing Sheets

OTHER PUBLICATIONS

V. D. Agrawal et al., "Design for Testability and Test Generation with Two Clocks," Proc. 4th Int'l. Symp. on VLSI Design, pp. 112–117, Jan. 1991.

K.L. Einspahr et al., "Clock Partitioning for Testability," Proc. $3^{rd}$ IEEE Great Lakes Symp. on VLSI, pp. 42–46, Mar. 1993.

K.L. Einspahr et al., "Improving Circuit Testability by Clock Control," Proc. 6th IEEE Great Lakes Symposium on VLSI, pp. 288–293, Mar. 1996.

K.L. Einspahr et al., "A Synthesis for Testability Scheme for Finite State Machines Using Clock Control," IEEE Transactions on CAD, vol. 18, No. 12, pp. 1780–1792, Dec. 1999.

S.H. Baeg et al., "A New Design for Testability Method: Clock Line Control Design," Proc. Custom Integrated Circuits Conf., pp. 26.2.1–26.2.4, 1993.

K.B. Rajan et al., "Increasing Testability by Clock Transformation (Getting Rid of Those Darn States)," Proc. VLSI Test Symp., pp. 1–7, Apr. 1996.

R. Gupta et al., "The Ballast Methodology for Structured Partial Scan Design," IEEE Trans. on Computers, vol. 39, No. 4, pp. 538–544, Apr. 1990.

T.M. Niermann et al., "PROOFS: A Fast, Memory–Efficient Sequential Circuit Fault Simulator," IEEE Trans. CAD, vol. 11, No. 2, pp. 198–207, Feb. 1992.

T.P. Kelsey et al., "An Efficient Algorithm for Sequential Circuit Test Generation," IEEE Trans. on Computers, vol. 42, No. 11, pp. 1361–1371, Nov. 1993.

M.A. Iyer et al., "Identifying Sequential Redundancies Without Search," Proc. 33rd Design Automation Conf., pp. 457–462, Jun. 1996.

D.E. Long et al., "FILL and FUNI: Algorithms to Identify Illegal States and Sequentially Untestable Faults," ACM Trans. on Design Automation of Electronic Systems, 27 pages, Jul. 2000.

I. Hamzaoglu et al., "New Techniques for Deterministic Test Pattern Generation," Proc. VLSI Test Symp, pp. 446–452, 15 pages, Apr. 1998.

* cited by examiner

SEQUENTIAL TEST PATTERN GENERATION USING COMBINATIONAL TECHNIQUES

FIELD OF THE INVENTION

The present invention relates generally to the design and testing of integrated circuits and other complex electronic circuits, and more particularly to techniques for generating test patterns for use in testing such circuits.

BACKGROUND OF THE INVENTION

Automatic test pattern generation (ATPG) for sequential circuits is an extremely expensive computational process. ATPG algorithms working on complex sequential circuits can spend many hours of central processing unit (CPU) time and still obtain poor results in terms of fault coverage. There are a number of factors that contribute to the difficulty of the ATPG process for sequential circuits. For example, it is generally necessary for an ATPG algorithm to use a model that includes an iterative array of time frames, where the number of time frames may be, in the worst case, an exponential function of the number of flip-flops (FFs) in the circuit. In addition, an ATPG algorithm may waste a substantial amount of time trying to justify illegal states. Furthermore, an ATPG algorithm typically must complete an exhaustive search for each target fault that is to be identified as untestable.

Because of the above-noted difficulties associated with the sequential ATPG problem, complex sequential circuits are generally tested using design for testability (DFT) techniques, such as scan design, which significantly change the structure of a given circuit so as to make its buried FFs more controllable and observable in test mode. However, scan-type DFT techniques introduce delay penalties that result in performance degradation, and substantially increase circuit area overhead thereby increasing power consumption and decreasing yield. In addition, scan-type DFT techniques are not directly compatible with at-speed testing.

A need therefore exists for techniques for performing ATPG for sequential circuits in a more efficient manner, so as to overcome the problems associated with conventional ATPG, while also avoiding the problems associated with existing DFT techniques such as scan design.

SUMMARY OF THE INVENTION

In accordance with one aspect of the invention, test pattern generation is performed for a sequential circuit by first separating the circuit into overlapping pipelines by controlling corresponding clocks for one or more registers of the circuit so as to break feedback loops of the circuit, and then processing each of the pipelines separately in order to determine if particular target faults are detectable in the pipelines. Independent clocks may be provided for each of a number of registers of the circuit, using a clock partitioning technique, in order to facilitate the breaking of the feedback loops for a given pipeline. The feedback loops may be broken by a clock freezing technique which involves freezing one or more of the independent clocks.

In accordance with another aspect of the invention, the processing of the pipelines includes a first processing operation which detects target faults in a single time frame, and a second processing operation which detects target faults in two or more time frames. The first processing operation generates as many combinational test vectors as possible for each of the pipelines, while the second processing operation generates sequences of two or more combinational test vectors for each of the pipelines.

The invention in an illustrative embodiment utilizes a design for testability (DFT) technique, based on a combination of partial clock freezing and clock partitioning, to model a sequential circuit as a set of overlapping pipelines. The illustrative embodiment is particularly well-suited for use in performing automatic test pattern generation (ATPG) for sequential circuits.

Advantageously, the test pattern generation process of the present invention solves the problems associated with conventional testing of sequential circuits without requiring a scan-based DFT approach that significantly changes the structure of the circuit in test mode. The DFT technique utilized in the illustrative embodiment of the invention, which as noted above is based on a combination of partial clock freezing and clock partitioning, introduces no delay penalties and only a small area overhead, and it is compatible with at-speed testing. The clock freezing approach utilized by the invention is a partial clock freezing approach in that the only flip-flops (FFs) that are frozen are those that are required to be frozen in order to break feedback loops in the circuit. The remaining FFs not frozen in this partial freezing approach are part of transparent or capture registers in a given pipeline, and are thus not used for test generation in that pipeline. A significant advantage of the partial freezing approach of the present invention is that it provides an exponential reduction in the search space of an ATPG process.

DETAILED DESCRIPTION OF THE INVENTION

Figure 1:
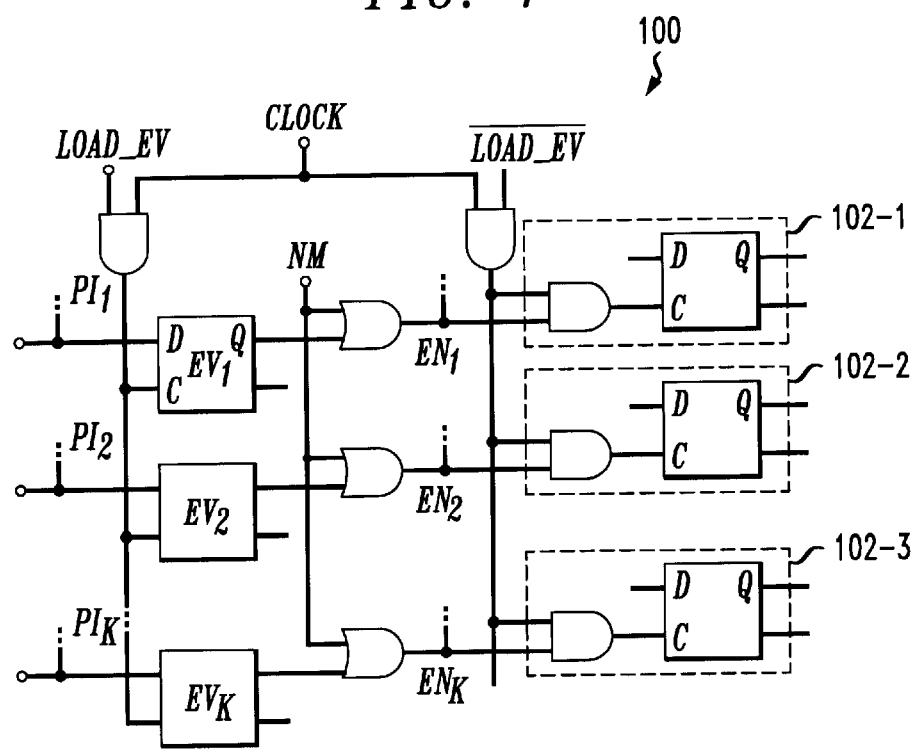
FIG. 1 shows a portion of a sequential circuit with clock partitioning based on the techniques of the invention.

The present invention will be illustrated herein using exemplary sequential circuits. It should be understood, however, that the techniques of the invention can be applied to any desired type of sequential circuit. The term "register" as used herein is intended to include any arrangement of one or more flip-flops (FFs) or other circuit storage elements. The term "freezing" as used herein in conjunction with a clock signal refers to any technique for interrupting or otherwise stopping the clock signal.

The present invention provides improved techniques for performing automatic test pattern generation (ATPG) that are particularly well-suited for use with sequential circuits. The invention in an illustrative embodiment utilizes a design for testability (DFT) technique, based on a combination of partial clock freezing and clock partitioning, to model a sequential circuit as a set of overlapping pipelines. Advantageously, this DFT technique of the present invention does not introduce any significant delay penalty and has a very small area overhead. The invention further provides an ATPG algorithm that takes advantage of the structure of the overlapping pipeline model to detect faults using combinational techniques which are several orders of magnitude faster than conventional sequential techniques.

In order to provide a better understanding of the invention, known aspects of clock freezing and clock partitioning will first be described in detail. Additional details regarding known aspects of clock freezing and clock partitioning can be found in U.S. Pat. No. 5,590,135 issued Dec. 31, 1996 and entitled "Testing a Sequential Circuit," and U.S. Pat. No. 5,625,630 issued Apr. 29, 1997 and entitled "Increasing Testability by Clock Transformation," respectively, both of which are commonly assigned herewith and incorporated by reference herein.

A well-known conventional technique for testing a sequential circuit involves activating the circuit clock and changing the state of the circuit with every applied input vector, so that in any state only one vector is applied. But there may be several vectors that detect different faults in a current state. For example, several fault effects could have been propagated to FFs of the circuit, and these fault effects may be propagated to primary outputs (POs) by different vectors. Similarly, the current state may be necessary to activate several other faults that may need different vectors to propagate their fault effects to POs. But with this type of conventional sequential testing, one can apply only one vector before the state is changed, so many fault-detection opportunities may have to wait for the next time that the current state is reached.

Clock freezing represents an improvement over the above-described one-vector-per-state technique, and is described in M. Abramovici et al., "FREEZE!: A New Approach for Testing Sequential Circuits," Proc. 29th Design Automation Conf., June 1992, and Y. Santoso et al., "FreezeFrame: Compact Test Generation Using a Frozen Clock Strategy," Proc. Design Automation and Test in Europe Conf., March 1999, both of which are incorporated by reference herein. In general, the clock freezing technique temporarily suspends the sequential behavior of the circuit by freezing its clock, such that several vectors may be applied without changing the current state. These vectors can be generated only by combinational ATPG algorithms. In this way, the current state is fully exploited before it is changed. This method does not require any DFT. However, in general, a circuit has many more FFs than primary inputs (PIs), and because all FFs are frozen, an ATPG algorithm working with one time frame is constrained in what it can accomplish. After all of the faults that can be detected in the current frozen state have been targeted, the sequential behavior of the circuit is enabled again, and the application of the next vector is accompanied by a clock pulse. Note that clock freezing does not change the difficulty of controlling the state transitions of the sequential circuit.

FIG. 1 illustrates a portion of a sequential circuit 100 which implements a clock partitioning technique of the present invention, based on the techniques described in the above-cited U.S. Pat. No. 5,625,630. In the normal operation of a sequential circuit, the same clock usually controls a large number of FFs. Clock partitioning divides the FFs sharing the same clock into several groups, so that in test mode each group can be independently clocked. The portion of the circuit 100 shown in FIG. 1 includes three independent groups, denoted 102-1, 102-2 and 102-3, each of which is shown as including a single FF but could include many FFs. In normal mode, NM=1 and LOAD_EV=0, so that CLOCK propagates to all FFs in the groups 102-1, 102-2 and 102-3. To avoid clock skewing, clock gating occurs within every FF group, so the routing of CLOCK to the FFs is not changed, although FFs that are always clocked may have their enabling input tied to logic 1. In test mode, NM=0, and the clock propagation is under the control of K enabling signals $EN_i$. The FFs controlled by the same enabling signal are in the same group. The enabling values $EV_i$ that determine the clock partitioning in test mode are stored in a separate set of K FFs as shown. These FFs are loaded from a corresponding set of K PIs when the LOAD_EV signal is asserted. At the same time, the clocking of all other FFs is disabled, so the K PIs that supply the enabling values may be arbitrarily selected. If K is larger than the number of available PIs, a simple scheme with loading of the enabling values in several stages may be used.

For a circuit with N FFs, the main component of the area overhead of this DFT clock partitioning technique is the N clock-enabling AND gates, which is less than the area overhead in scan design. This overhead can be eliminated if clock skewing in test mode can be controlled. In addition, there are K additional FFs and K OR gates, but usually K<<N, so this overhead is negligible. Note that the operating frequency of the circuit is not affected by the clock control mechanism, since no delays are introduced in data paths. Moreover, unlike scan design, clock control DFT is fully compatible with at-speed testing.

Other aspects of clock partitioning are described in greater detail in, e.g., V. D. Agrawal et al., "Design for Testability and Test Generation with Two Clocks," Proc. 4th Int'l. Symp. on VLSI Design, pp.112–117, January 1991, K. L. Einspahr et al., "Clock Partitioning for Testability," Proc. $3^{rd}$ IEEE Great Lakes Symp. on VLSI, pp. 42–46, March 1993, K. L. Einspahr et al., "Improving Circuit Testability by Clock Control," Proc. 6th IEEE Great Lakes Symposium on VLSI, pp. 288–293, March 1996, K. L. Einspahr et al., "A Synthesis for Testability Scheme for Finite State Machines Using Clock Control," IEEE Transactions on CAD, Vol. 18, No. 12, December, 1999, S. H. Baeg et al., "A New Design for Testability Method: Clock Line Control Design," Proc. Custom Integrated Circuits Conf., pp. 26.2.1–26.2.4, 1993, and K. B. Rajan et al., "Increasing Testability by Clock Transformation (Getting Rid of Those Darn States)," Proc. VLSI Test Symp., April, 1996, all of which are incorporated by reference herein.

Clock partitioning increases the testability of the sequential circuit, by reducing dependency among FF values and introducing many more state transitions in a state transition graph of the circuit, thus making states that are illegal or difficult to reach easier to reach in test mode. As a result, some faults that were impossible or difficult to detect in the original circuit become easier to test. Clock partitioning is also useful for delay-fault testing. Nonetheless, although a sequential circuit with conventional clock partitioning is easier to test than the same circuit without the clock partitioning, performing conventional ATPG for the transformed circuit, i.e., without using the improved techniques of the present invention, still requires sequential techniques and is therefore inefficient.

As noted previously, the present invention combines partial clock freezing with clock partitioning in order to model a sequential circuit as a set of overlapping pipelines, such that an ATPG algorithm can detect faults using combinational techniques. While in conventional clock freezing all FFs of the circuit are frozen, using the partial freezing of the present invention only a subset of the FFs have their clocks inactive. This subset is selected so that all feedback loops in the circuit are temporarily cut.

Figure 2:
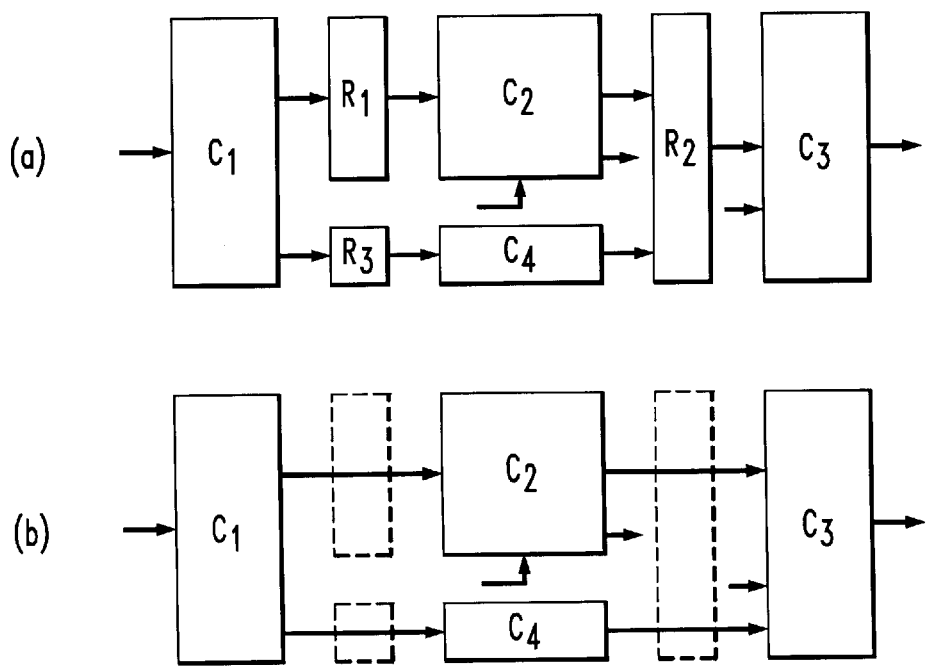
FIGS. 2(a) and 2(b) show an example pipeline circuit and a corresponding test generation model.

It has been shown, for example, in R. Gupta et al., "The Ballast Methodology for Structured Partial Scan Design," IEEE Trans. on Computers, Vol. 39, No. 4, pp. 538–544, April 1990, that test generation in a pipeline circuit can be done by combinational techniques. FIG. 2(a) shows an example of a circuit in the form of a pipeline, including combinational blocks $C_1$, $C_2$, $C_3$ and $C_4$, and registers $R_1$, $R_2$ and $R_3$. One way to test the circuit of FIG. 2(a) is to apply an input vector, and then clock the circuit twice such that the effect of the input vector propagates throughout the entire circuit. Since the registers $R_1$, $R_2$ and $R_3$ serve only to transmit the data, these elements can be made effectively transparent for ATPG, and the circuit can be modeled as the combinational circuit shown in FIG. 2(b). Thus the application of every combinational vector generated for this model has to be accompanied by clocking of all transparent registers, and the number of required clocks is equal to the sequential depth of the pipeline.

The pipeline in the example of FIG. 2(a) is balanced, in that every path between two combinational blocks $C_i$ and $C_j$ goes through the same number of registers. In a balanced pipeline, a combinational ATPG algorithm can detect every fault detectable in the original circuit. In an unbalanced pipeline, some faults untestable in the combinational model may be detected in the original pipeline.

Figure 3:
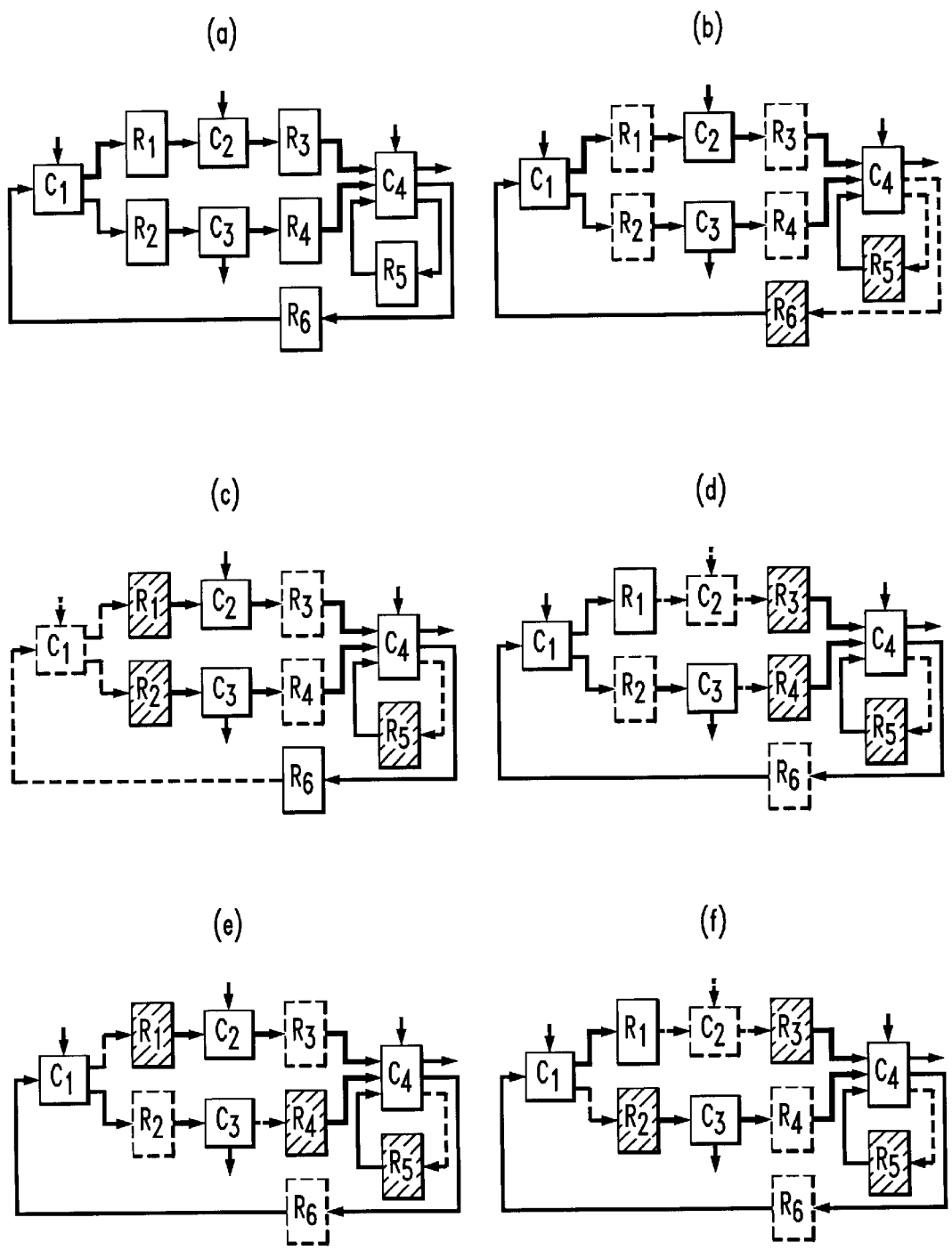
FIGS. 3(a) through 3(f) show an example sequential circuit and five different overlapping pipelines that may be generated from the original circuit using the techniques of the invention.

FIGS. 3(a) through 3(f) illustrate the approach of the present invention in greater detail. In this example, clock partitioning is implemented by allocating an independent clock to each of the registers $R_1$ through $R_6$ of the original circuit as shown in FIG. 3(a). To create pipelines, all of the feedback loops in the original circuit are cut. Any conventional loop-cutting algorithm used to select scan FFs for partial scan design can be used in this operation. However, instead of cutting a given feedback loop by scanning registers, the feedback loop is cut in accordance with the present invention by temporarily freezing one or more of the registers along the loop. These registers are said to be "frozen" and are shown as shaded in the pipelines of FIGS. 3(b) through 3(f). In this example circuit, there are five different ways to cut the feedback loops, so there are five different overlapping balanced pipelines, each shown in one of FIGS. 3(b) through 3(f). Note that register $R_5$ is frozen in every pipeline, while any other register is frozen only in at most two pipelines.

In accordance with the invention, the example circuit of FIGS. 3(a) through 3(f) is processed using one pipeline at a time. Given its frozen registers, the model for a given one of the pipelines may be constructed by a test pattern generator as follows:

1. Treat FFs of the frozen registers as PIs with frozen values that cannot be changed by the test pattern generator.
2. Exclude any "invisible" combinational logic that directly feeds only frozen registers.
3. Model any register that is not frozen and feeds POs (directly or indirectly) as transparent.
4. Any other register (not frozen and not transparent) is flagged as a capture register.

For example, in FIG. 3(c), $R_1$, $R_2$ and $R_5$ are frozen registers, $R_3$ and $R_4$ are transparent, and $R_6$ is a capture register. A capture register feeds only invisible logic ($C_1$ in FIG. 3(c)), so it cannot be used to detect faults in the current pipeline. But one can use $R_6$ in the FIG. 3(c) pipeline to capture fault effects to be propagated in the future in a pipeline where $R_6$ will be frozen, i.e., the pipeline of FIG. 3(b). Similarly, in FIG. 3(d), $R_3$, $R_4$ and $R_5$ are frozen registers, $R_2$ and $R_6$ are transparent, and $R_1$ is a capture register.

It should be noted that the type of clock freezing illustrated in FIGS. 3(b) through 3(f) is a partial freeze, rather than a complete freeze of all registers as in the above-cited reference M. Abramovici et al., "FREEZE!: A New Approach for Testing Sequential Circuits," Proc. 29th Design Automation Conf., June 1992. The latter complete freeze approach freezes all FFs of the circuit, while the partial freezing approach of the present invention freezes only a subset of the FFs, that is, those necessary to break all feedback loops of the circuit. The remaining FFs not frozen in this partial freezing approach are part of transparent or capture registers in a given pipeline, and are thus not used for test generation in that pipeline. A significant advantage of the partial freezing approach of the present invention is that it provides an exponential reduction in the search space of the ATPG algorithm.

It should also be noted that many pipelines can be obtained from the same circuit, by combining different ways of cutting each feedback loop. But not all of these pipelines are necessary for test generation. For example, it can be seen that the "visible" logic (that is, the logic not behind a frozen register) in the pipelines in FIG. 3(c) and FIG. 3(f) is also included in the pipeline in FIG. 3(b), while the visible logic in the pipeline in FIG. 3(d) is also included in the pipeline in FIG. 3(e). Thus for test generation it will be sufficient to consider only the pipelines in FIG. 3(b) and FIG. 3(e), as any detectable fault can be detected in one of these two pipelines.

Figure 4:
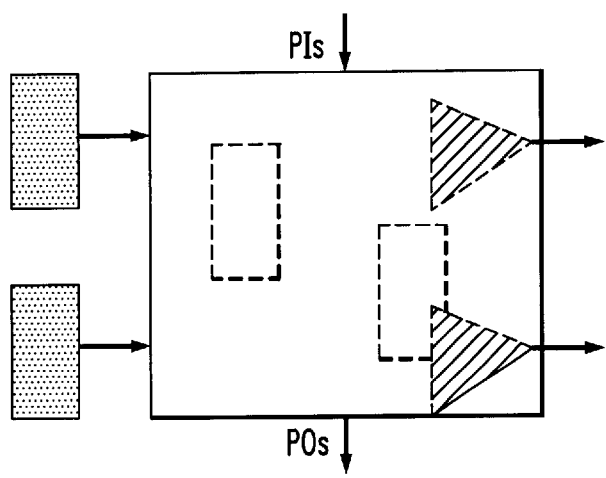
FIG. 4 shows a model of an example pipeline for a single time frame in accordance with the invention.

FIG. 4 illustrates the model of a given pipeline, with the invisible logic shown as shaded triangles. Here, one time frame corresponds to d conventional time frames, where d is the sequential depth of the pipeline. It is important to note that a register frozen in one pipeline may be transparent in another pipeline. Thus, applying a combinational vector in one pipeline may change the state of the frozen registers in all other pipelines.

Figure 5:
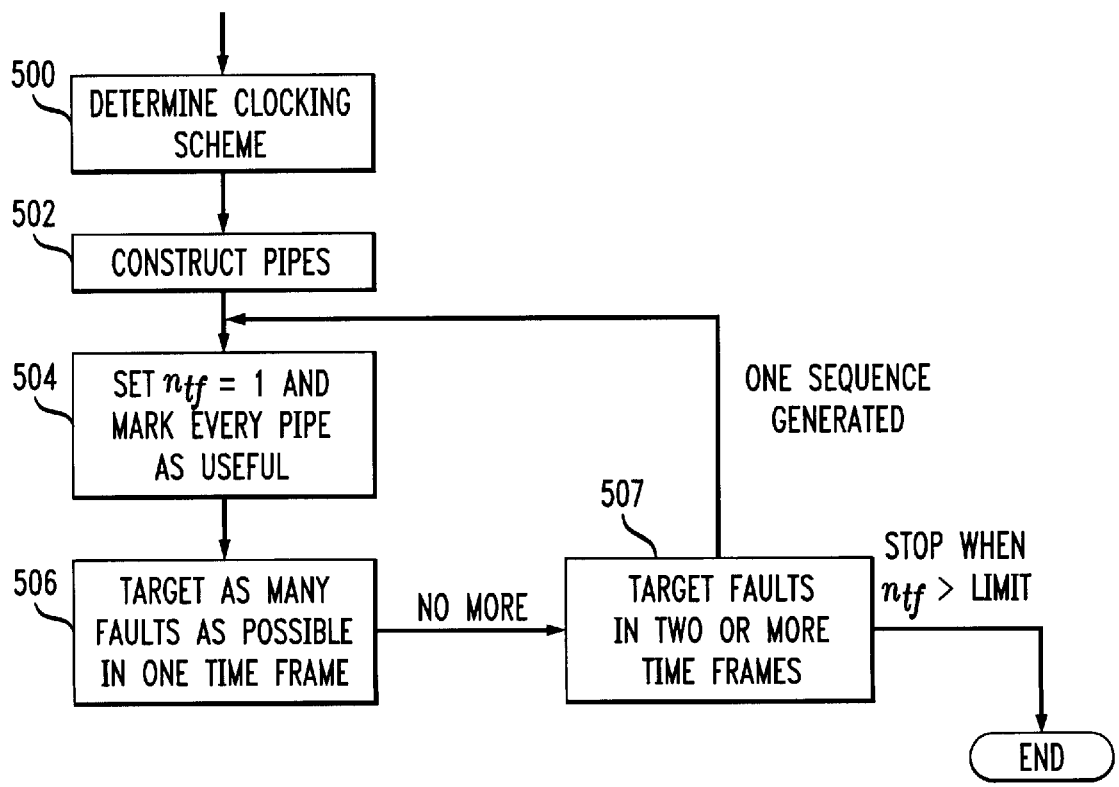
FIG. 5 is a flow diagram of a test pattern generation process in accordance with the invention.

FIG. 5 is a flow diagram of a test generation process in accordance with the present invention, based on the above-described techniques. Step 500 determines the clocking scheme by grouping together the FFs that will share a given independent clock, in accordance with the previously-described clock partitioning techniques. In the example of FIGS. 3(a) through 3(f), an independent clock was provided for each of the registers $R_1$ through $R_6$ using clock partitioning, although other arrangements are of course possible. Then in step 502 the pipelines are constructed, in the manner previously described in conjunction with FIGS. 3(a) through 3(f). A variable $n_{tf}$ represents the number of time frames in the current pipeline, and is initially set to 1 in step 504. Step 504 also marks pipelines as useful.

A given pipeline is said to be useful if it has undetected faults that may be detected in the presence of input values already assigned. Initially, the only assigned input values are the values of the FFs in the frozen registers of the pipeline. The FIG. 5 process is opportunistic in that in every step it tries to detect as many faults as possible using the shortest possible test sequence. Test generation takes place in steps 506 and 507, which are shown in greater detail in FIGS. 6 and 7, respectively. Step 506 targets as many faults as possible in one time frame, and step 507 targets faults in two or more time frames. Step 506 thus generates as many combinational vectors as possible, while step 507 generates one sequence of two or more such vectors. Steps 504, 506 and 507 are repeated after one such sequence has been generated. The process ends when $n_{tf}$ after step 507 is greater than a specified limit.

Figure 6:
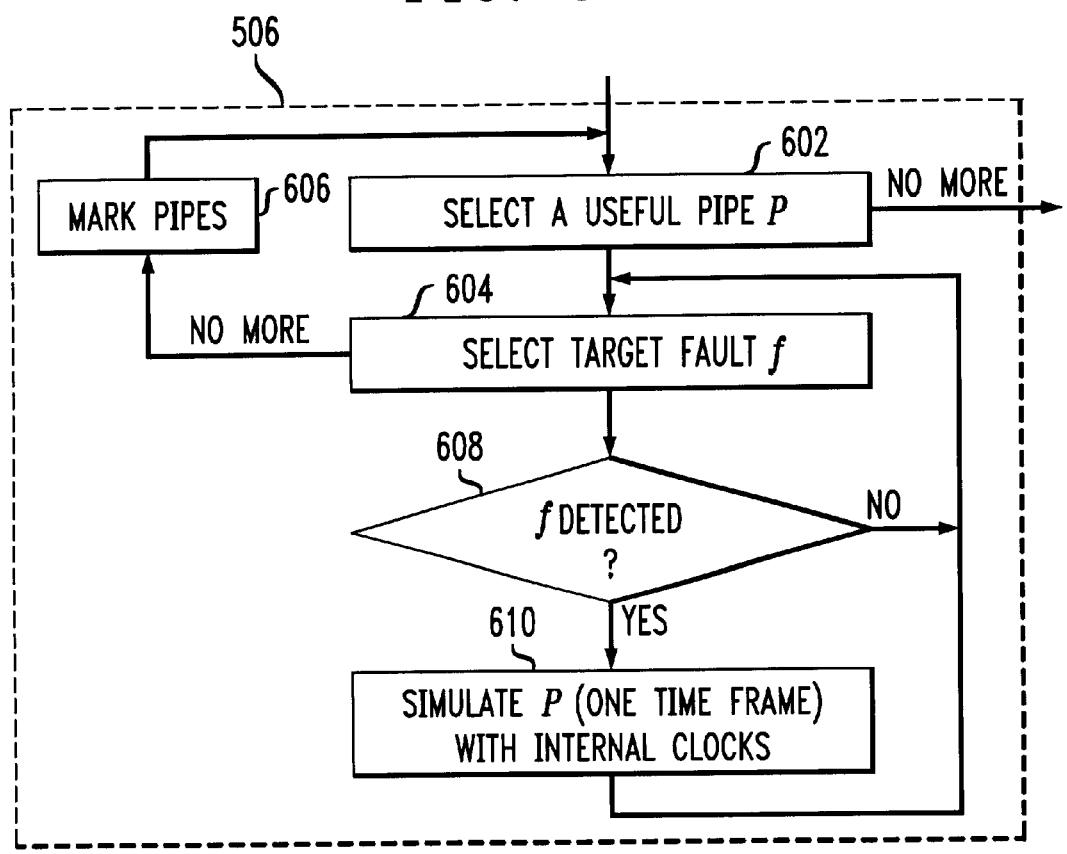
FIGS. 6 and 7 are flow diagrams showing additional details regarding particular operations in the FIG. 5 flow diagram.

FIG. 6 shows a more detailed view of step 506 of FIG. 5. In step 602, a given useful pipeline P is selected. A target fault f is selected in step 604. If there are no more target faults, the current pipeline is marked as not useful as indicated in step 606. For a given target fault f, a determination is made in step 608 as to whether the target fault f is detected. If it is not detected, the process returns to step 604 to select another target fault. If the target fault f is detected, the pipeline P is simulated for one time frame with internal clocks.

Step 506 of the FIG. 5 process thus simulates every generated combinational vector, dropping the detected faults and keeping track of the faults still possible to detect in one time frame. When no more target faults are found, the current pipeline is marked as not useful. At the same time, any pipeline whose frozen register is a transparent or a capture register of the current pipeline is checked for usefulness, since its state has been changed, and new fault effects may be stored in its FFs or the new state may allow new faults to be detected. The entire process is repeated until no more useful pipelines can be found.

Figure 7:
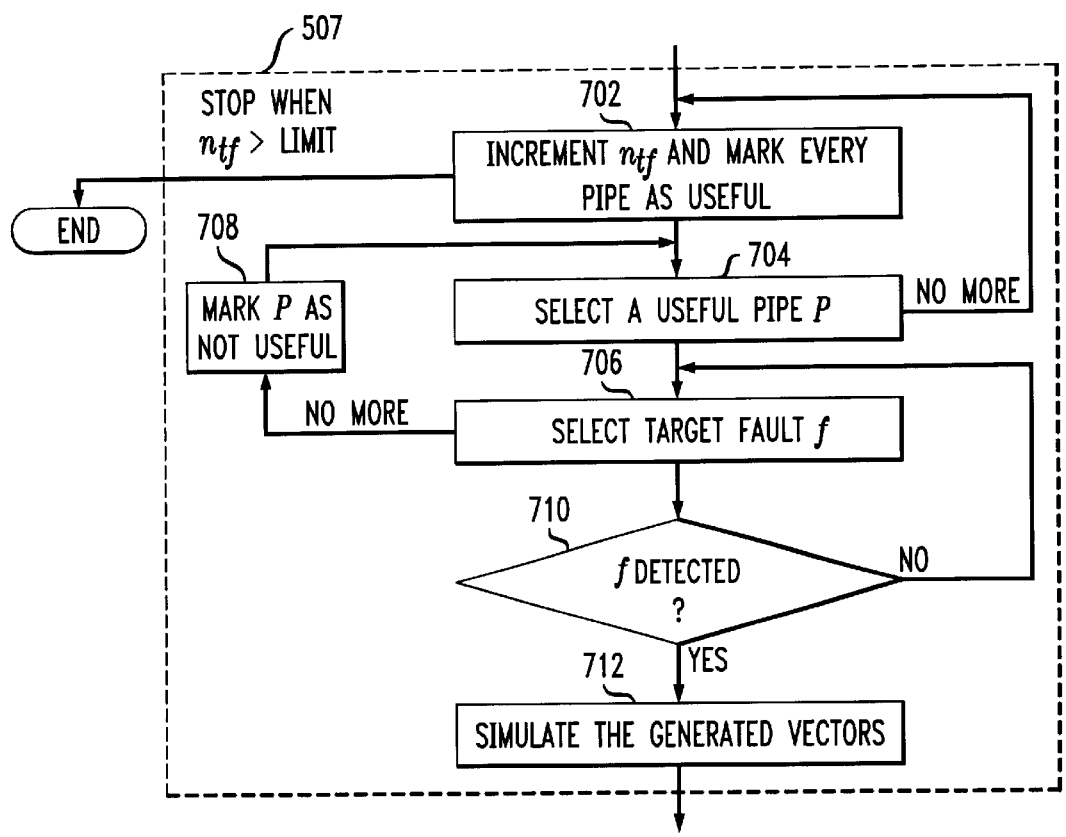

FIG. 7 shows a more detailed view of step 507 of FIG. 5. In step 702, $n_{tf}$ is incremented and all pipelines are marked as useful. A useful pipeline P is selected in step 704, and a target fault f is selected in step 706. If there are no more useful pipelines in step 704, the process returns to step 702 to again increment $n_{tf}$. If there are no more target faults in step 706 for the selected pipeline P, that pipeline is marked in step 708 as not useful, and the process returns to step 704 to select another useful pipeline. Step 710 determines if a particular target fault f selected in step 706 is detected. If it is detected, the generated vectors are simulated in step 712. Otherwise, the process returns to step 706 to select another target fault.

Figure 8:
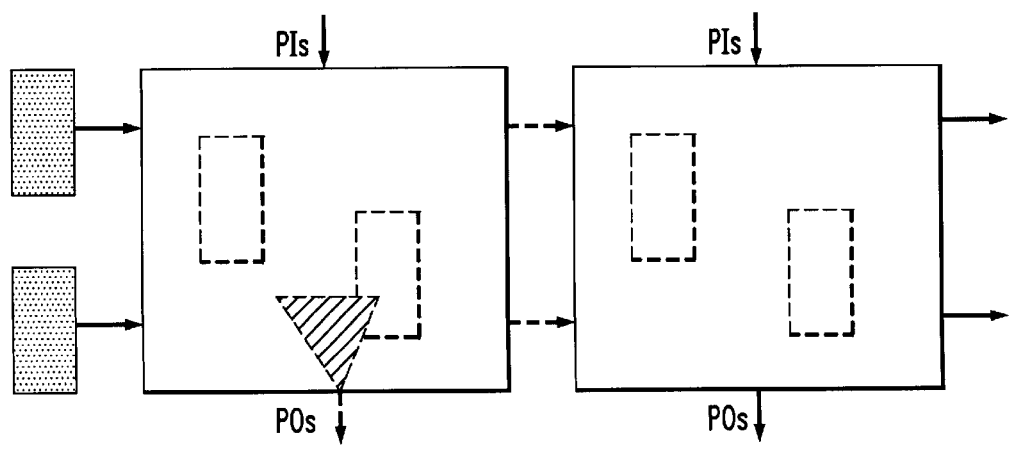
FIG. 8 shows a model of an example pipeline for two time frames in accordance with the invention.

Step 507 of the FIG. 5 process is thus first trying to generate a sequence of two vectors for a useful pipeline, using the model shown in FIG. 8 for two time frames (the number of vectors is equal to the number of time frames $n_{tf}$). If unsuccessful, $n_{tf}$ is incremented and step 507 is repeated. The transition between time frames involves firing at least one of the frozen clocks of the pipeline. The test generation process is therefore configured to determine the frozen clock(s) to be fired. Note that the state of a register that is frozen in every pipeline, such as $R_5$ in FIGS. 3(b) through 3(f), can be changed only in this way. Additional clock partitioning for the FFs of such a frozen register would increase the testability of the circuit.

The application of a combinational vector in one time frame requires clocking of all the transparent registers of the pipeline, and the capture registers should also be clocked. When one sequence with $n_{tf}$ vectors has been successfully generated, the state of the current pipeline, as well as that of any other pipeline whose frozen register is transparent or a capture register in the current pipeline, has been changed. The process then returns to step 506 to attempt to generate combinational vectors over a single time frame.

While the FIG. 5 test generation process works with one pipeline at a time, the generated vectors are expanded to account for clocking of the transparent registers, and the resulting sequences may be fault simulated for the entire circuit using, e.g., a fault simulator such as the PROOFS fault simulator described in T. M. Niermann et al., "PROOFS: A Fast, Memory-Efficient Sequential Circuit Fault Simulator," IEEE Trans. CAD, vol. 11, no. 2, pp. 198–207, February, 1992, which is incorporated by reference herein. Note that in the test generation model, the POs are observed only after all the transparent registers have been clocked, but in the fault simulation model they are observed after every clock. This is equivalent to applying several random vectors in between the "real" vectors, and these random vectors may detect additional faults. The results of the fault simulator may be supplied back into the test pattern generator to enable fault dropping and for reporting the fault effects stored in registers. The test pattern generator and the fault simulator may be implemented as separate software programs which communicate via conventional sockets.

The example test generation process of FIG. 5 may be configured to backtrace all objectives to PIs (or backtrace-stop lines) without stopping at time frame boundaries, as described in, e.g., T. P. Kelsey et al., "An Efficient Algorithm for Sequential Circuit Test Generation," IEEE Trans. on Computers, Vol. 42, No 11, pp. 1361–1371, November 1993, which is incorporated by reference herein. Advantageously, this avoids the state justification problem and hence the test generation process never has to deal with illegal states.

The existence of frozen values at the PIs of a pipeline may preclude the activation and the observation of several still undetected faults. The FIG. 5 process removes these faults from the set of target faults for the pipeline, so that only potentially detectable faults will be targeted. Faults whose effects are stored in observable frozen FFs are also considered potentially detectable. The number of potentially detectable faults determines the usefulness of the pipeline. Following its opportunistic strategy, the FIG. 5 process always selects the most useful pipeline as the next one to work on.

A number of preprocessing steps may be used in conjunction with the FIG. 5 test generation process. For example, the FIRES algorithm described in M. Iyer et al., "Identifying Sequential Redundancies Without Search," Proc. 33rd Design Automation Conf., June 1996, and the FUNI algorithm described in D. E Long et al., "FILL & FUNI: Algorithms To Identify Illegal States and Sequentially Untestable Faults," ACM Trans. on Design Automation of Electronic Systems, July 2000, both of which are incorporated by reference herein, may be used to identify combinationally and sequentially untestable faults.

Other techniques for identifying untestable faults are described in U.S. Pat. No. 5,559,811, issued Sep. 24, 1996 and entitled "Method For Identifying Untestable & Redundant Faults In Sequential Logic Circuits," and U.S. Pat. No. 5,566,187, issued Oct. 10, 1996 and entitled "Method For Identifying Untestable Faults In Logic Circuits," both of which are commonly assigned herewith and incorporated by reference herein.

In addition, the combinational test pattern generator ATOM described in I. Hamzaoglu et al., "New Techniques for Deterministic Test Pattern Generation," Proc. VLSI Test Symp, pp. 446–452, April 1998, which is incorporated by reference herein, may be run on a full-scan model of the circuit to identify the rest of the combinationally untestable faults. Any untestable faults identified by these preprocessing operations are removed from the set of target faults used by the FIG. 5 process. These same faults would be much more computationally expensive to target in test generation.

The FIG. 5 process may be implemented in a conventional personal computer, workstation or other processor-based system. For example, the process may be implemented as one or more software programs executed on a Pentium III computer with 256 Mb memory, a Sun SPARC Ultra-Enterprise computer, or other suitable processor-based system.

Figure 9:
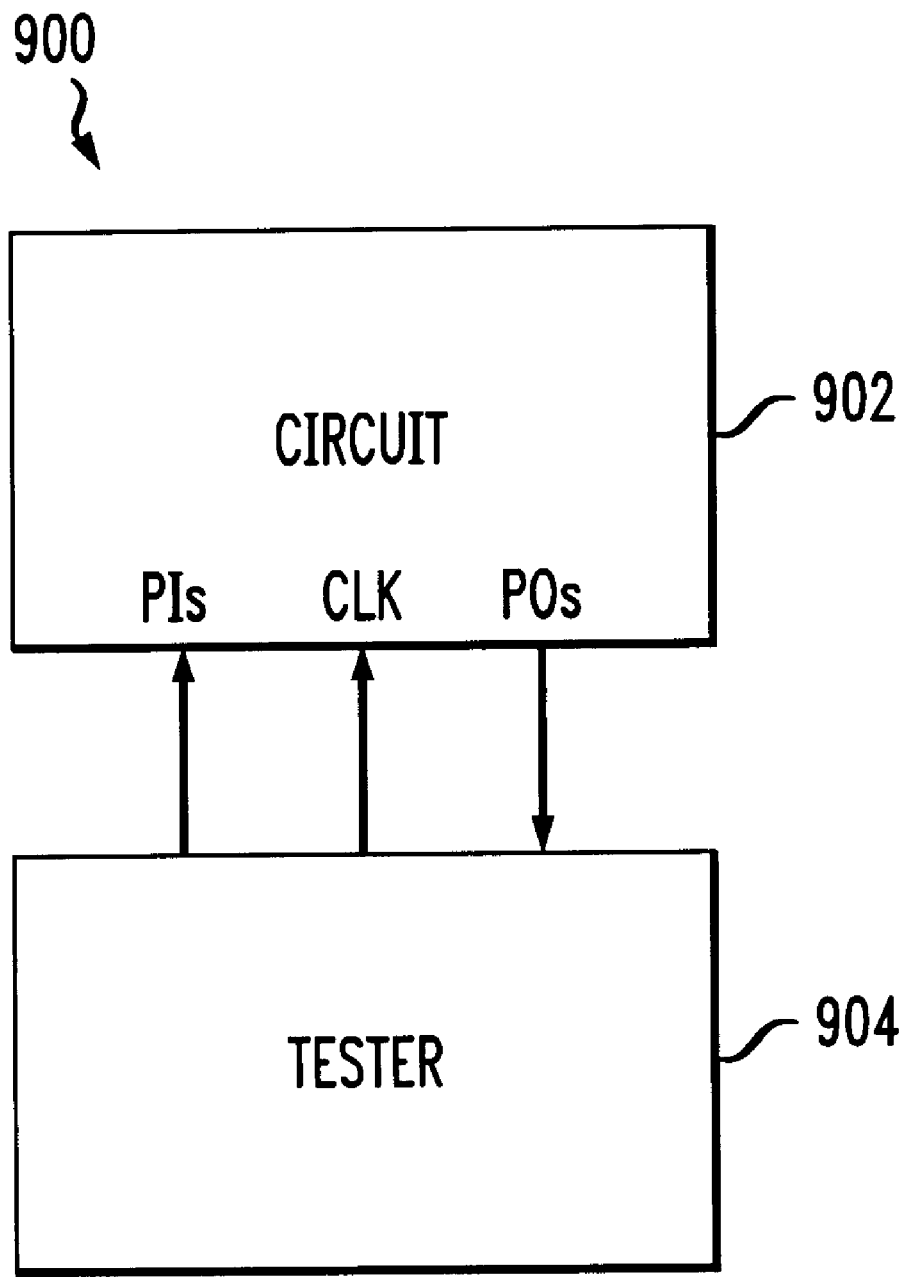
FIG. 9 shows a block diagram of a test configuration in which the invention may be implemented.

FIG. 9 shows one example of a test system in which the invention may be implemented. In this example, a circuit 902 is coupled to a tester 904. The tester 904 supplies PIs and one or more clock signals to the circuit 902 and observes the POs of the circuit 902. The tester 904 may be external to the circuit 902 as shown in the figure or alternatively may be viewed as an embedded tester that is incorporated within the circuit 902. In the case of an embedded tester, the combinational vectors may be randomly generated, and the tester can keep a given vector constant while applying clocks to transparent registers. This type of embedded tester is an example of a built-in self-test (BIST) implementation of the present invention.

The tester 904 may be a computer or other processor-based device which implements a test pattern generator in accordance with the invention. For example, one or more software programs for implementing the test pattern generation process of FIG. 5 may be stored in a memory of the tester 904 and executed by a processor thereof.

Advantageously, the test pattern generation process of the present invention provides a solution to an important problem in the testing of sequential circuits that heretofore has been considered impossible to solve without significantly changing the structure of the circuit in test mode. The DFT technique utilized in the illustrative embodiment of the invention is based on a combination of clock freezing and clock partitioning, introduces no delay penalties and only a small area overhead, and it is compatible with at-speed testing.

The above-described embodiments of the invention are intended to be illustrative only. For example, alternative embodiments may be configured which utilize different processing platforms. The invention may also be implemented in part in software, e.g., in one or more software programs stored on a computer-readable medium or other type of storage medium, and in various combinations of hardware and software. These and numerous other alternative embodiments within the scope of the following claims will be apparent to those skilled in the art.

What is claimed is:

1. A method of performing test pattern generation for a circuit, the method comprising the steps of:

separating the circuit into a plurality of overlapping pipelines by controlling corresponding clocks for one or more registers of the circuit so as to break feedback loops of the circuit; and processing each of the pipelines separately in order to determine if particular target faults are detectable in the pipelines.

2. The method of claim 1 wherein each of at least a subset of the registers of the circuit is controlled by an independent clock.

3. The method of claim 1 wherein a given one of the clocks associated with at least one of the registers is controlled so as to break a particular feedback loop of the circuit by freezing that clock.

4. The method of claim 1 wherein each of at least a subset of the overlapping pipelines comprises a balanced pipeline in which every path between two combinational blocks $C_i$ and $C_j$ of the circuit passes through the same number of registers.

5. The method of claim 1 wherein for a given one of the pipelines each of a plurality of flip-flops associated with a register having a clock which has been frozen in that pipeline is processed as a primary input of the circuit having a frozen value that cannot be changed during the test pattern generation process.

6. The method of claim 1 wherein for a given one of the pipelines combinational logic of the circuit that feeds only one or more registers having clocks which have been frozen in that pipeline is removed from that pipeline.

7. The method of claim 1 wherein for a given one of the pipelines any one of the registers having a clock which is not frozen and which feeds primary outputs of the circuit is designated as a transparent register in that pipeline.

8. The method of claim 1 wherein for a given one of the pipelines any one of the registers having a clock which is not frozen and which feeds only combinational logic of the circuit that feeds one or more registers having clocks which are frozen in the given pipeline is designated as a capture register and cannot be used to detect faults in the given pipeline.

9. The method of claim 1 wherein the processing step further comprises a first processing step which detects target faults in a single time frame, and a second processing step which detects target faults in two or more time frames.

10. The method of claim 9 wherein the first processing step generates as many combinational test vectors as possible for each of at least a subset of the pipelines.

11. The method of claim 9 wherein the second processing step generates a sequence of two or more combinational test vectors for a specified number of two or more time frames for each of at least a subset of the pipelines.

12. The method of claim 1 wherein at least the separating and processing steps are implemented in a test generator which is external to the circuit.

13. The method of claim 1 wherein at least the separating and processing steps are implemented in a test generator which is embedded within the circuit in a built-in self-test (BIST) configuration, the test generator generating one or more combinational vectors in a random manner.

14. An apparatus for performing test pattern generation for a circuit, the apparatus comprising:

a processor-based device operative to separate the circuit into a plurality of overlapping pipelines by controlling corresponding clocks for one or more registers of the circuit so as to break feedback loops of the circuit, and to process each of the pipelines separately in order to determine if particular target faults are detectable in the pipelines.

15. The apparatus of claim 14 wherein each of at least a subset of the registers of the circuit is controlled by an independent clock.

16. The apparatus of claim 14 wherein a given one of the clocks associated with at least one of the registers is controlled so as to break a particular feedback loop of the circuit by freezing that clock.

17. The apparatus of claim 14 wherein each of at least a subset of the overlapping pipelines comprises a balanced pipeline in which every path between two combinational blocks $C_i$ and $C_j$ of the circuit passes through the same number of registers.

18. The apparatus of claim 14 wherein for a given one of the pipelines each of a plurality of flip-flops associated with a register having a clock which has been frozen in that pipeline is processed as a primary input of the circuit having a frozen value that cannot be changed during the test pattern generation process.

19. The apparatus of claim 14 wherein for a given one of the pipelines combinational logic of the circuit that feeds only one or more registers having clocks which have been frozen in that pipeline is removed from that pipeline.

20. The apparatus of claim 14 wherein for a given one of the pipelines any one of the registers having a clock which is not frozen and which feeds primary outputs of the circuit is designated as a transparent register in that pipeline.

21. The apparatus of claim 14 wherein for a given one of the pipelines any one of the registers having a clock which is not frozen and which feeds only combinational logic of the circuit that feeds one or more registers having clocks which are frozen in the given pipeline is designated as a capture register and cannot be used to detect faults in the given pipeline.

22. The apparatus of claim 14 wherein the processor-base device is further operative to process the pipelines using a first processing operation which detects target faults in a single time frame, and a second processing operation which detects target faults in two or more time frames.

23. The apparatus of claim 22 wherein the first processing operation generates as many combinational test vectors as possible for each of at least a subset of the pipelines.

24. The apparatus of claim 22 wherein the second processing operation generates a sequence of two or more combinational test vectors for a specified number of two or more time frames for each of at least a subset of the pipelines.

25. The apparatus of claim 14 wherein the processor-based device comprises a test generator which is external to the circuit.

26. The apparatus of claim 14 wherein the processor-based device comprises a test generator which is embedded within the circuit in a built-in self-test (BIST) configuration, the test generator generating one or more combinational vectors in a random manner.

27. An apparatus for performing test pattern generation for a circuit, the apparatus comprising:

means for separating the circuit into a plurality of overlapping pipelines by controlling corresponding clocks for one or more registers of the circuit so as to break feedback loops of the circuit; and means for processing each of the pipelines separately in order to determine if particular target faults are detectable in the pipelines.

28. An article of manufacture comprising a storage medium containing one or more software programs for use in performing test pattern generation for a circuit, wherein the one or more software programs when executed by a processor implement the steps of:

separating the circuit into a plurality of overlapping pipelines by controlling corresponding clocks for one or more registers of the circuit so as to break feedback loops of the circuit; and processing each of the pipelines separately in order to determine if particular target faults are detectable in the pipelines.

* * * * *